United States Patent [19]
Perego

[11] Patent Number: 5,252,052
[45] Date of Patent: Oct. 12, 1993

[54] MOLD FOR MANUFACTURING PLASTIC INTEGRATED CIRCUITS INCORPORATING A HEAT SINK

[75] Inventor: Camillo Perego, Monza, Italy

[73] Assignee: SGS-Thomson Microelectronics S.r.l., Milan, Italy

[21] Appl. No.: 813,910

[22] Filed: Dec. 23, 1991

[30] Foreign Application Priority Data

Dec. 28, 1990 [IT] Italy ................ 22552 A/90

[51] Int. Cl.⁵ ................................ B29C 45/14
[52] U.S. Cl. ..................... 425/116; 249/95; 264/272.17
[58] Field of Search .......... 264/272.15, 272.17; 425/116, 117, 129.1, 110; 249/95

[56] References Cited

U.S. PATENT DOCUMENTS

| | | | |
|---|---|---|---|
| 3,238,286 | 3/1966 | Davis | 425/117 |
| 3,423,516 | 1/1969 | Segerson | 264/272.17 |
| 3,471,900 | 10/1969 | Burns | 249/95 |
| 3,606,673 | 9/1971 | Overman | 264/272.17 |
| 3,930,114 | 12/1975 | Hodge | 264/272.17 |
| 4,453,903 | 6/1984 | Pukaite | 249/95 |
| 4,705,469 | 11/1987 | Leibl et al. | 425/117 |
| 4,900,501 | 2/1990 | Saeki et al. | 264/272.17 |
| 5,091,341 | 2/1992 | Asada et al. | 437/112 |
| 5,098,626 | 3/1992 | Pas | 264/272.17 |
| 5,108,955 | 4/1992 | Ishida et al. | 264/272.17 |
| 5,135,694 | 8/1992 | Akahane et al. | 264/272.17 |
| 5,147,821 | 9/1992 | McShane et al. | 264/272.17 |

FOREIGN PATENT DOCUMENTS

| | | | |
|---|---|---|---|
| 0443508A1 | 8/1991 | European Pat. Off. | |
| 52-43366 | 4/1977 | Japan | 264/272.17 |
| 57-191011 | 11/1982 | Japan | |
| 60-182142 | 9/1985 | Japan | 425/117 |
| 61-032434 | 2/1986 | Japan | |
| 61-170038 | 7/1986 | Japan | 425/116 |
| 62-15827 | 1/1987 | Japan | 425/117 |
| 1-187830 | 7/1989 | Japan | |
| 2-306639 | 12/1990 | Japan | |

Primary Examiner—Jay H. Woo
Assistant Examiner—Robert B. Davis
Attorney, Agent, or Firm—Rosen, Dainow & Jacobs

[57] ABSTRACT

A mold for the manufacture of integrated circuit packages of plastics, incorporating a heat sink, includes a first half-shell having a rest bottom for the heat sink, which is associated with a metal frame having a central portion carrying the integrated circuit and being held by filaments, and a second half-shell arranged to overlie the first and having at least one elevated portion which mates with a recessed portion in the first half-shell to compress the filaments on the half-shells being laid over each other.

5 Claims, 1 Drawing Sheet

MOLD FOR MANUFACTURING PLASTIC INTEGRATED CIRCUITS INCORPORATING A HEAT SINK

This invention relates to a mold for manufacturing plastic integrated circuit packages, which incorporate a heat sink comprised of a first half-shell with a rest bottom for the heat sink which is associated with a metal frame having a central portion carrying the integrated circuit and being held by filaments or braces.

It is a well-known fact that, in the specific technical field to which this invention is related, many plastic containers or "packages" have a metal mass conglomerated therewith to promote dissipation of heat developed by the integrated circuit during its operation.

This is the case, for instance, with packages for most power circuits.

To produce such packages, the prior art has proposed several methods, of which the most widely employed one comprises the following steps.

From thin sheet metal, a thin frame is formed as by some blanking process which has a central rest portion whence multiple flat filament conductors branch off, among which are so-called supporting braces.

Secured on the central portion is a semiconductor integrated circuit having its base in direct contact with said portion.

Selected metalized regions of the integrated circuit are connected electrically to said filament conductors by means of thin wires.

A metal mass serving as a heat sink is soldered to the central portion of the frame, on the remote side from the integrated circuit.

Lastly the frame, complete with the integrated circuit and the heat sink, is conglomerated to a body of synthetic resin formed by injecting a heat setting plastic material, such as an epoxy resin, under a high pressure into a purposely provided mold.

To prevent the conductive filaments of the frame from contacting one another and being shorted out during the injection step, it matters that the resin be a highly flowable one.

However, this has a drawback in that plastic flash often develops over the heat sink due to imperfect mating of the heat sink with the mold.

Known are methods directed to improve the adhesion of the heat sink to the mold, e.g. through the provision of some pre-load arrangements for biasing the heat sink toward the mold. Such methods cannot be used, however, with integrated circuits of comparatively large size which be associated with extremely thin frames also performing heat sink functions.

Flash is customarily removed, anyhow, by subjecting a package to a further step of abrasive processing of the exposed surface of the heat sink.

It may be appreciated, however, that this is a cost-intensive and time-consuming procedure penalizing the end product.

The underlying technical problem of this invention is to provide a mold which has such constructional and operational features as to yield substantially flash-free packages over the exposed surface of the heat sink, thereby overcoming the drawbacks with which the prior art is beset.

This technical problem is solved by a mold as indicated being characterized in that it comprises a second, enclosing half-shell arranged to overlie the first and mate therewith, which second half-shell has at least one elevated portion effective to compress said filaments.

In a preferred embodiment, the elevated portion rises by at least 0.05 mm above the mating surface of the half-shell.

BRIEF DESCRIPTION OF THE DRAWINGS

The features and advantages of a mold according to the invention will become more clearly apparent from the following detailed description of an embodiment thereof, given by way of example and not of limitation with reference to the accompanying drawing.

In the drawing.

Figure 1:
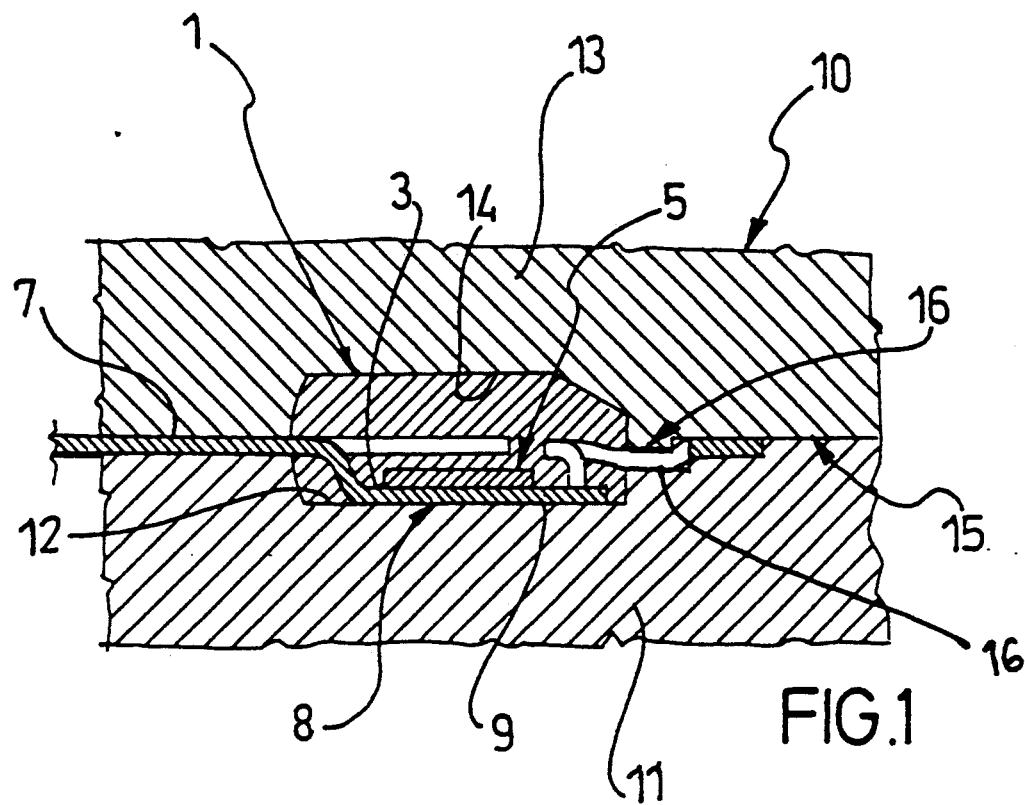
FIG. 1 is an enlarged scale, cross-sectional view taken through a portion of the inventive mold which is closed around a plastic package for integrated circuits, and, FIGS. 2 and 3 are plan and sectional views, respectively, of a part of a package at an intermediate stage of its processing.

With reference to the drawing, generally shown at 1 is a container or "package" formed from a plastics material to enclose and protect a semiconductor-type integrated circuit.

The package 1 is made by first cutting off from thin sheet metal, as by a blanking or etching process, a thin lead frame 7 which has a supporting central portion 3 and multiple flat filament conductors branching off the central portion 3.

Figure 2:
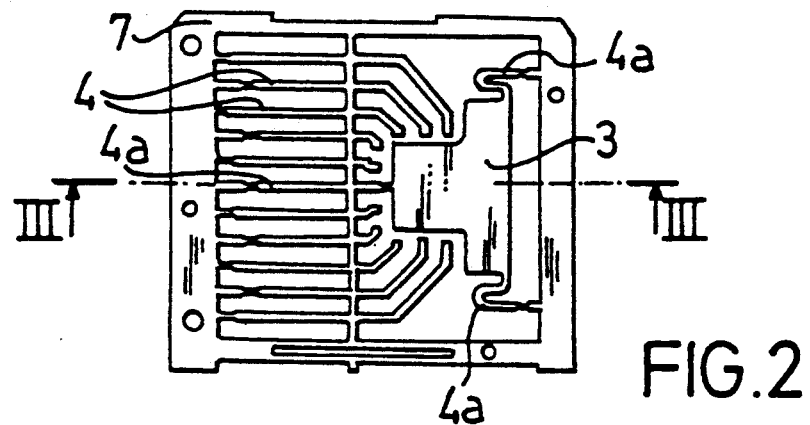
Figure 3:
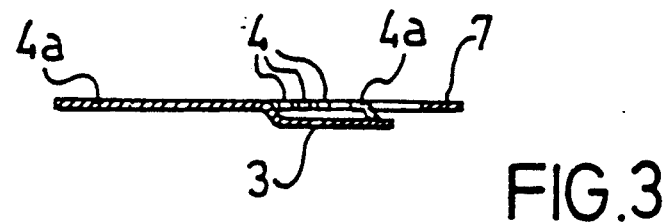

These filaments 4, with the exception of some of them referred to as the braces and being shown at 4a in FIG. 2 and joined to the portion 3 to support it, have an inward end separated from the central portion 3 but located close to it.

Laid onto the portion 3 is a silicon semiconductor chip 5 in which the integrated circuit is formed.

The chip base is secured on the central portion 3, and selected metalized regions of the chip 5 are connected electrically to the conductors 4 by thin wires (not shown).

The frame 7 also has a depressed part which contains the central portion 3 and serves as a heat sink 8.

The frame 7, complete with the chip 5, is then placed into a mold 10, and a resin, such as a heat setting polymer, is injected in a liquid state into the mold.

The frame 7 is so inserted into the mold 10 as to have its remote surface 9 from that carrying the chip 5 in direct contact with the bottom 12 of the mold 10.

The latter consists of a pair of half-shells 11, 13 mating together to overlie each other and enclosing an inner space whereinto the epoxy resin is injected.

The half-shells 11 and 13 have corresponding surfaces, facing each other in mating relationship, and defining a closure plane for the mold 10.

Advantageously, according to the invention, the second half-shell 13 includes at least one elevated portion 16 which stands proud (facing downward in FIG. 1) of the surface 15.

This portion rises at least 0.05 mm above said surface 15 (extends below in the FIG. 1 view with half-shell 13 on top). Below and opposite to the elevated portion 16 are recessed regions 16'. The braces 4a are located in the space between the elevated portions 16 and recessed regions 16'.

With the two half-shells 11, 13 of the mold 10 overlying each other, and the mold closed, the elevated portion 16 of half-shell 13 will compress the braces 4a against the bottom of the mold 10 and into the recessed regions 16', thereby establishing a pressure between the central portion 3 and the bottom 12 of the mold.

Upon true seating adhesion of the two half-shells of the mold 10 being achieved, the injection of liquid state resin is started. After the resin has cured, the package 1 is shaken out of the mold using conventional shake-out means.

Further to cutting off those parts of the frame which join together the filaments on the exterior of the formed plastic body, the package is ready for installation on any printed circuit.

It will be apparent from the foregoing description that the mold of this invention has a major advantage in that it allows plastic packages to be manufactured which are completely free of flash over the exposed surface of the heat sink.

This contributes, of course, to a reduction in the production burden and the product cost.

I claim:

1. A mold for manufacturing plastic integrated circuit packages which incorporate a heat sink, comprising a first half-shell with a rest bottom for a heat sink constituting the central portion of a metal lead frame and carrying an integrated circuit chip and being held by braces on the frame, a second half-shell arranged to overlie the first such that a surface thereof mates with a corresponding surface of the first half-shell, said first half shell having along its mating surface recessed regions positioned to underlie the braces, said second half-shell having along its mating surface elevated portions opposite to the recessed regions and effective to compress said braces when the mold is closed with the metal frame inside so as to press the central portion tightly against the rest bottom.

2. A mold according to claim 1, wherein said elevated portion rises by at least 0.05 mm above the mating surface plane of the half-shells.

3. In combination, a metal lead frame having filaments and having a heat-sinking central portion carrying an integrated circuit chip and connected to the frame by flat supporting braces and a mold for plastic encapsulating the lead frame and integrated circuit while leaving the outside of the central portion exposed and free of plastic; said mold comprising a first half-shell with a rest bottom and receiving the central portion of the metal frame, a second half-shell arranged to overlie the first half-shell such that a surface of the second half-shell mates with a corresponding surface of the first half-shell, said first half-shell having along its mating surface recessed regions underlying the frame braces, said second half-shell having along its mating surface elevated portions opposite to the recessed regions and effective to compress said braces into the recesses when the half-shells are closed with the lead frame in place thereby biasing the central portion tightly against the rest bottom to avoid flashing of plastic material between the central portion and the rest bottom when liquid plastic is introduced into the closed mold.

4. The combination of claim 3, wherein said elevated portion rises by at least 0.05 mm above the mating surface plane of the half-shells.

5. The combination of claim 3, wherein three spaced braces are provided connecting the central portion to the lead frame.

* * * * *